United States Patent
Takahashi et al.

(10) Patent No.: US 7,197,817 B2
(45) Date of Patent: Apr. 3, 2007

(54) METHOD FOR FORMING CONTACT BUMPS FOR CIRCUIT BOARD

(75) Inventors: Nobuaki Takahashi, Kanagawa (JP); Yuji Akimoto, Tokyo (JP); Mikio Oda, Tokyo (JP); Hikaru Kouta, Tokyo (JP)

(73) Assignees: NEC Electronics Corporation (JP); NEC Corporation (JP)

( * ) Notice: Subject to any disclaimer, the term of this patent is extended or adjusted under 35 U.S.C. 154(b) by 391 days.

(21) Appl. No.: 10/755,983

(22) Filed: Jan. 13, 2004

(65) Prior Publication Data

US 2004/0139603 A1 Jul. 22, 2004

(30) Foreign Application Priority Data

Jan. 17, 2003 (JP) ............................. 2003-010192

(51) Int. Cl.
*H05K 3/20* (2006.01)

(52) U.S. Cl. ............................. 29/830; 29/831; 29/842; 29/846; 29/874; 174/262

(58) Field of Classification Search ................. 29/825, 29/830–834, 884, 874, 846; 427/96, 79, 427/80; 174/255, 257, 260–262; 205/78, 205/67
See application file for complete search history.

(56) References Cited

U.S. PATENT DOCUMENTS

| | | | | |
|---|---|---|---|---|
| 4,564,323 A | * | 1/1986 | Berbalk | 409/200 |
| 5,354,205 A | * | 10/1994 | Feigenbaum et al. | 439/67 |
| 5,453,404 A | * | 9/1995 | Leedy | 438/479 |
| 6,351,885 B2 | * | 3/2002 | Suzuki et al. | 29/847 |
| 6,454,159 B1 | * | 9/2002 | Takushima | 228/253 |

FOREIGN PATENT DOCUMENTS

JP  58-048445  3/1983

* cited by examiner

*Primary Examiner*—Minh Trinh
(74) *Attorney, Agent, or Firm*—Hayes Soloway P.C.

(57) ABSTRACT

Disclosed is a method of forming bump electrodes on wired circuit boards. A high-concentration impurity Si template doped with boron and having a pit formed therein is prepared. A plated resist is formed on the high-concentration impurity Si template and an opening is formed at the position of the pit. Then, an electric field is applied to the high-concentration impurity Si template and Au is buried in the opening in the plated resist to form a Au-plated buried layer. An electrode pad is formed on a semiconductor chip. With the plated resist separated from the high-concentration impurity Si template, the electrode pad of the semiconductor chip is aligned with the Au-plated buried layer and is bonded by thermo-compression bonding. The Au-plated buried layer is transferred to the electrode pad to form an Au bump on the semiconductor chip.

15 Claims, 7 Drawing Sheets

METHOD FOR FORMING CONTACT BUMPS FOR CIRCUIT BOARD

BACKGROUND OF THE INVENTION

1. Field of the Invention

The present invention relates to a wired board with bump electrodes and a method of fabricating the same, and, more particularly, to a bump electrode and a method of fabricating the same.

2. Description of the Related Art

There is a fabrication method for a wired board with bump electrodes which is discussed below.

FIGS. 1A to 1E are schematic cross-sectional views showing a conventional fabrication method of a wired board with bump electrodes.

As shown in FIG. 1A, a minute pit 11 with a pyramid shape is formed on a silicon (Si) substrate 10 by anisotropic etching.

Next, a metal film 12 is formed on the Si substrate 10 and a resist 13 is plated and formed on the metal film 12, then the plated resist 13 is opened at the upper portion of the pit 11, as shown in FIG. 1B.

Then, an Au layer 14 to be an electrode is buried in the opening in the plated resist 13 by plating, as shown in FIG. 1C.

Next, an Sn-plated copper lead 15 is aligned with the pit 11 and the Au layer 14, and an Sn plating 16 applied to the copper lead 15 is contacted to the Au layer 14 and is bonded to the Au layer 14 by thermo-compression bonding, thus yielding an Au—Sn alloy between the Sn plating 16 and the Au layer 14 as shown in FIG. 1D.

As the Sn-plated copper lead 15 is separated from the Si substrate 10 thereafter, the Au layer 14 formed on the Si substrate 10 is transferred to the Sn-plated copper lead 15, forming an Au protruding electrode on the Sn plating 16.

In this case, a high-concentration diffusion layer may be used in place of the metal film 12 (see Japanese Patent Laid-Open No. 48445/1983).

However, the prior art has a shortcoming such that it the metal film 12 is formed on the Si substrate 10, the Au layer 14 is not transferred to the Sn-plated copper lead 15 efficiently because of a high adhesion strength between the metal film 12 at the pit 11 and the Au layer 14.

On the other hand, the formation of a high-concentration diffusion layer in place of the metal film 12 requires thermal diffusion or ion injection to the Si substrate 10 over a long period of time, and thus takes time. This makes it difficult to mass-produce products, which may lead to a cost-up of the products.

Further, as the adhesion strength between the high-concentration diffusion layer of the Si substrate 10 at the pit 11 and the Au layer 14 is low, the Au layer 14 may be separated from the Si substrate 10 by external force, such as shocks, applied at the time of, for example, transporting or washing the Au-formed Si substrate, thus lowering the yield.

SUMMARY OF THE INVENTION

Accordingly, it is an object of the present invention to provide a wired board with bump electrode and a fabrication method thereof in which the production efficiency of bump electrodes is improved.

To achieve the object, a method of fabricating a wired board with bump electrode according to the present invention comprises the steps of forming a resist having an opening on a high-concentration impurity semiconductor base; forming a conductive layer in the opening in the resist; and forming a bump electrode on the wired board by aligning an electrode pad formed on the wired board with the conductive layer and then transferring the conductive layer to the electrode pad.

Specifically, the method of fabricating a wired board with bump electrode according to the invention selectively forms the pit in a semiconductor base, such as Si base, which is doped with any one of impurities B, P, As, Sb and Pt at a high concentration, forms a plated resist layer, aligns the plated resist layer with, for example, the pit, forms an opening in the plated resist layer, buries a conductor of any one of Au, Cu, Ni, Pt, Pd, Ag, Sn and Pb, or an alloy or paste containing any one of the elements in the opening, then transfers the conductor to the bonded wired board, thereby forming bump electrode on the wired board.

A wired board with bump electrodes according to the invention is fabricated by the above-described fabrication method.

DETAILED DESCRIPTION OF THE PREFERRED EMBODIMENTS

Preferred embodiments of the present invention are described below with reference to the accompanying drawings.

(First Embodiment)

FIGS. 2A to 2D are schematic step-by-step cross-sectional views showing a fabrication method of a wired board with bump electrodes according to a first embodiment of the invention.

Figure 1A:
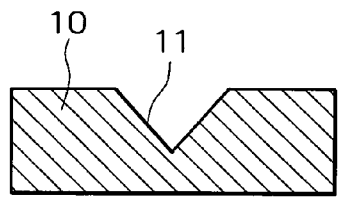
FIGS. 1A to 1E are schematic cross-sectional views showing a conventional fabrication method of a wired board with bump electrodes
Figure 1D:
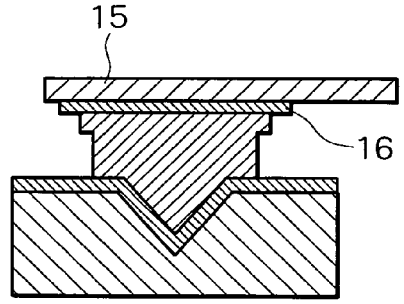
Figure 1B:
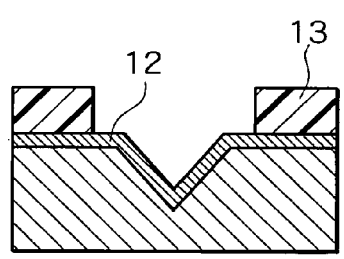
Figure 1E:
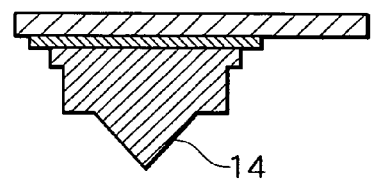
Figure 1C:
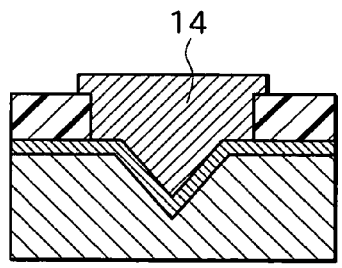
Figure 2A:
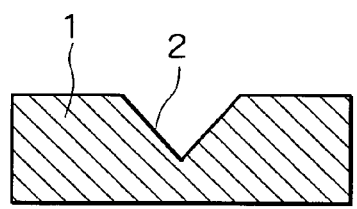
FIGS. 2A to 2D are schematic cross-sectional views showing a fabrication method of a wired board with bump electrodes according to a first embodiment of the invention, in order of the steps.

First, as shown in FIG. 2A, a high-concentration impurity Si template 1, as a high-concentration impurity semiconductor base, is fabricated by forming a minute pit 2 at a surface of an Si substrate. The minute pit 2 has a pointed shape, a pentahedron shape, a pyramid shape or a hemispherical shape and has an opening with a size of 10 μm×10 μm and a depth of about 2 μm. The Si substrate has an impurity such as boron injected therein at a high concentration of, for example, $1 \times 10^{17}$ cm$^{-3}$ or higher to have a low electric resistance of $1 \times 10^{-1}$ Ω-cm or lower.

Figure 2C:
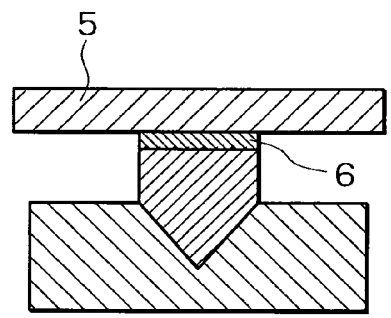
Figure 2B:
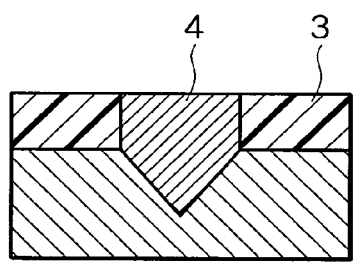

Next, a resist 3 having a thickness of about 10 μm is plated and formed on the high-concentration impurity Si template 1 and the resist 3 is opened at the pit 2, as shown in FIG. 2B. Subsequently, an electric field is applied to the high-concentration impurity Si template 1 and Au is buried in the opening in the plated resist 3 by electrolytic plating to form an Au-plated buried layer 4 with a size of, for example, 10 μm×10 μm.

An electrode pad 6 of Al, Au or so with a size of, for example, 10 μm×10 μm is formed on a semiconductor chip 5. After the plated resist 3 is separated from the high-concentration impurity Si template 1, the electrode pad 6 on the semiconductor chip 5, as a wired board, is aligned with the Au-plated buried layer 4 and is bonded together by thermo-compression bonding or the like, as shown in FIG. 2C. At this time, applying vibration energy such as ultrasonic waves or so ensures more effective bonding of the electrode pad 6 and the Au-plated buried layer 4.

Figure 2D:
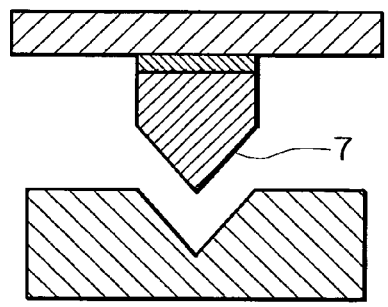

Finally, the Au-plated buried layer 4 is transferred is to the electrode pad 6 to form an Au bump 7 whose distal end has the shape of a pyramid in case the minute pit 2 has a pyramid shape, as shown in FIG. 2D.

An oxide layer may be formed in place of the plated resist 3. The concentration of the impurity should be in a range of $1 \times 10^{15}$ cm$^{-3}$ to $1 \times 10^{22}$ cm$^{-3}$. Further, P, As, Pt or Sb may be used as the impurity instead of boron (B). The Au-plated buried layer 4 may be replaced with a plated buried layer formed of any one of Au, Cu, Ni, Pt, Pd, Ag, Sn, and Pb, or an alloy containing any one of those metals.

The Au-plated buried layer 4 may also be replaced with a paste of any of the aforementioned materials. It is preferable that the material should have a high electric conductance. Further, the Au-plated buried layer or its equivalence may b formed by electroless plating, sputtering, vapor deposition or printing and the layer forming method is not particularly limited.

Although the use of the semiconductor chip 5 is mentioned in the foregoing description of the embodiment, it can be any substrate on wires are to be formed and which needs electric connection to an external circuit via bump electrodes.

As the high-concentration impurity Si template 1 is doped with an impurity at a high concentration and has a low electric resistance, it is unnecessary to form a seed layer of electrolytic plating again and au can be buried in the pit 2 by electrolytic plating by applying and electric field to the high-concentration impurity Si template 1 itself. This eliminates the need for a process of injecting an impurity at a high concentration, thus leading to a reduction in the number of required steps and cost reduction.

A depth of said pit may be made equal to or greater than ¼ of a thickness of said resist.

(Second Embodiment)

FIGS. 3A to 3E are schematic cross-sectional views showing a fabrication method of a wired board with bump electrodes according to a second embodiment of the invention, in order of the steps. In FIGS. 3A to 3E, same reference symbols are given to those components which are the same as the corresponding components in FIGS. 2A to 2D.

Figure 3A:
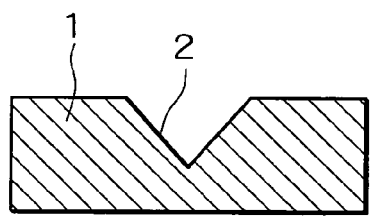
FIGS. 3A to 3E are schematic cross-sectional views showing a fabrication method of a wired board with bump electrodes according to a second embodiment of the invention, in order of the steps.
Figure 3B:
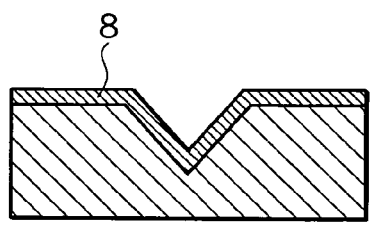
Figure 3C:
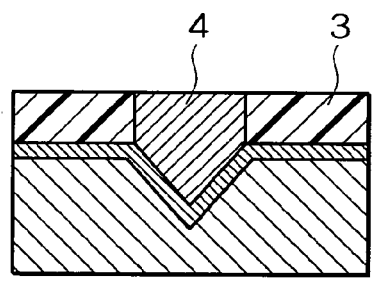
Figure 3D:
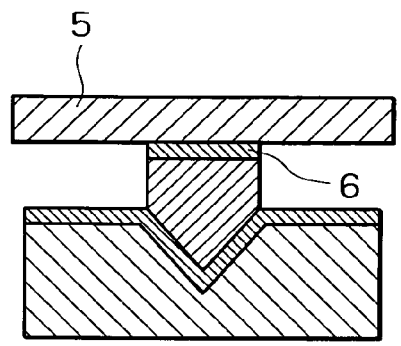
Figure 3E:
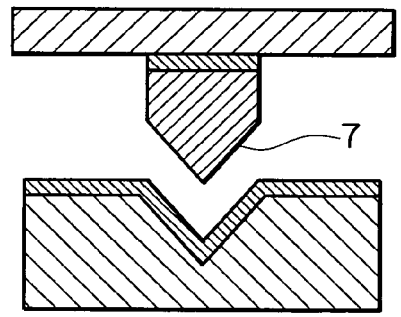

The top surface of the high-concentration impurity Si template 1 is made rough by soft etching, sand blasting or so, thereby forming a rough layer 8 as shown in FIG. 3B, The steps as shown in FIGS. 3A and 3C to 3E are the same as those in FIGS. 2A to 2D.

The rough layer 8 may be formed only in the pit 2.

According to the embodiment, the provision of the rough layer 8 on the high-concentration impurity Si template 1 increases the boding force between the high-concentration impurity Si template 1 and the Au-plated buried layer 4 adequately, thereby preventing separation of the Au-plated buried layer 4 during the handling of the device.

(Third Embodiment)

FIGS. 4A to 4E are schematic cross-sectional views showing a fabrication method of a wired board with bump electrodes according to a third embodiment of the invention, in order of the steps. In FIGS. 4A to 4E, same reference symbols are given to those components which are the same as the corresponding components in FIGS. 2A to 2D.

Figure 4A:
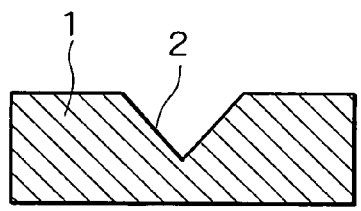
FIGS. 4A to 4E are schematic cross-sectional views showing a fabrication method of a wired board with bump electrodes according to a third embodiment of the invention, in order of the steps.
Figure 4B:
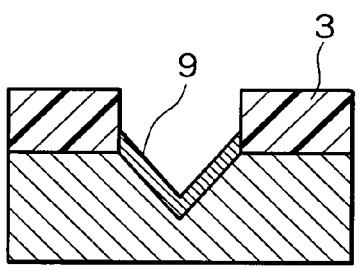
Figure 4C:
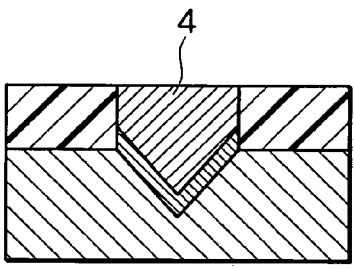
Figure 4D:
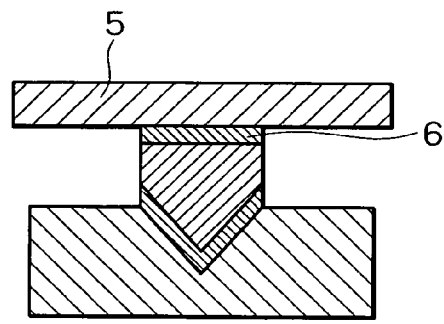

The resist 3 is plated and formed on the high-concentration impurity Si template 1 and is opened at the pit 2, an Au strike plating is applied to the inner surface of the pit 2 to thereby form an Au strike plated layer 9, as shown in FIG. 4B. The Au strike plated layer 9 has a higher adhesion strength than the Au-plated buried layer which is formed by electric-plating.

The steps as shown in FIGS. 4A and 4C to 4E are the same as those in FIGS. 2A to 2D.

Figure 4E:
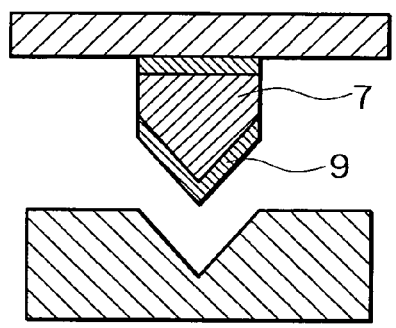

In this embodiment, as the semiconductor chip 5 is separated from the high-concentration impurity Si template 1 at the interface between the pit 2 and the Au strike plated layer 9, the Au strike plated layer 9 is included in the Au bump 7 as shown in FIG. 4E.

Further, the embodiment adequately increases the adhesion strength between the high-concentration impurity Si template 1 and the Au-plated buried layer 4 by forming the Au strike plated layer 9 inside the pit 2 of the high-concentration impurity Si template 1 to thereby preventing separation of the Au-plated buried layer 4 during the handling of the device.

(Fourth Embodiment)

FIGS. 5A to 5D are schematic cross-sectional views showing a fabrication method of a wired board with bump electrodes according to a fourth embodiment of the invention, is in order of the steps. In FIGS. 5A to 5D, same reference symbols are given to those components which are the same as the corresponding components in FIGS. 2A to 2D.

Figure 5A:
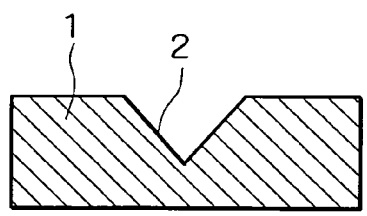
FIGS. 5A to 5D are schematic cross-sectional views showing a fabrication method of a wired board with bump electrodes according to a fourth embodiment of the invention, in order of the steps.
Figure 5B:
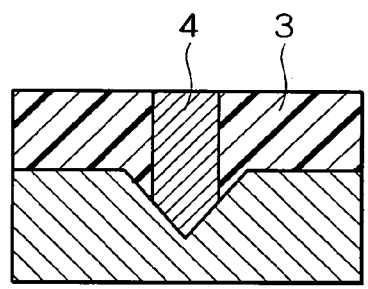

The resist 3 is plated and coated on the high-concentration impurity Si template 1 and is opened in such a way that the size of the openings becomes smaller than that of the pit 2, Au is buried in the openings by electrolytic plating to form the Au-plated buried layer 4 having a size of, for example, 6 μm×6 μm. as shown in FIG. 5B.

Figure 5C:
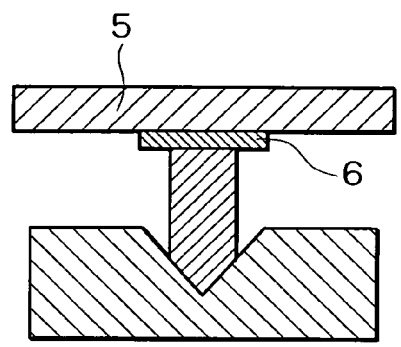
Figure 5D:
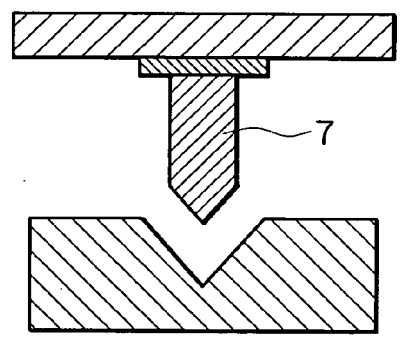

The steps as shown in FIGS. 5A, 5C and 5D are the same as those in FIGS. 2A, 2C and 2D.

It is to be noted that the rough layer 8 may be formed inside the pit 2 or on the high-concentration impurity Si template 1 as shown in FIG. 3B, or the An strike plated layer 9 may be formed inside the pit 2 as shown in FIG. 4B.

Because the size of the opening in the plated resist 3 is made smaller than the size of the pit 2 in this embodiment, it is possible to form the Au bump 7 which has a large aspect ratio and whose distal end has the shape of a pyramid. This structure makes it harder to cause short-circuiting between adjoining metal bumps. This is advantageous in forming a narrow-pitch pattern. In case where the semiconductor chip 5 with such Au bump 7 is connected to an unillustrated substrate by flip-chip connection, even if external force is applied to the substrate or the semiconductor chip 5, the Au bump 7 can relax the stress, making the separation of the An bump 7 from the electrode pad 6 harder and improving the operational reliability.

In case where the wired board is to be mounted on a product whose portability is demanded, particularly, it is necessary to make the pitch size of the Au bump 7 smaller in order to make the product lighter and thinner, so that the third embodiment which makes the size of the opening in the plated resist 3 smaller than the size of the pit 2 is desirable.

In case where the wired board is to be mounted on a low-cost product, it is often unnecessary to make the product lighter and thinner, so that the pitch size of the Au bump 7 need not be made smaller. Therefore, the size of the opening in the plated resist 3 may be made larger than the size of the pit 2 to reduce the aspect ratio, thus enhancing the strength of the metal bumps.

(Fifth Embodiment)

FIGS. 6A to 6D are schematic cross-sectional views showing a fabrication method of a wired board with bump electrodes according to a fifth embodiment of the invention, in order of the steps. In FIGS. 6A to 6D, same reference symbols are given to those components which are the same as the corresponding components in FIGS. 2A to 2D.

Figure 6A:
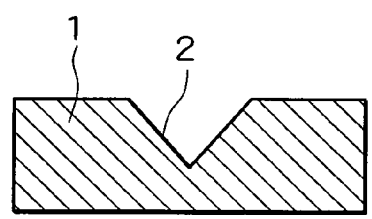
FIGS. 6A to 6D are schematic cross-sectional views showing a fabrication method of a wired board with bump electrodes according to a fifth embodiment of the invention, in order of the steps.
Figure 6B:
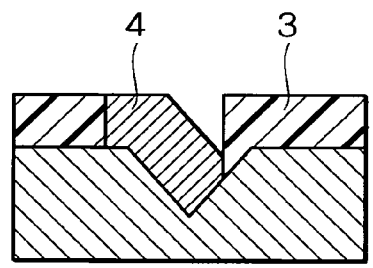
Figure 6C:
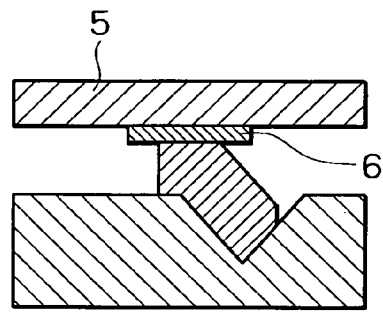
Figure 6D:
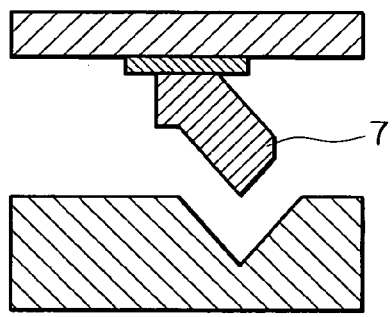

The resist 3 is plated and formed on the high-concentration impurity Si template 1 and is opened at that portion of the plated resist 3 which is not aligned with the pit 2, an electric field is applied to the entire high-concentration impurity Si template 1, Au is buried in the openings in the plated resist 3 by electrolytic plating to form the Au-plated buried layer 4 as shown in FIG. 6B.

The steps as shown in FIGS. 2A, 2C and 2D are the same as those in FIGS. 2A, 2C and 2D.

It is to be noted that the rough layer 8 may be formed inside the pit 2 or on the high-concentration impurity Si template 1 as shown in FIG. 3B, or the Au strike plated layer 9 may be formed inside the pit 2 as shown in FIG. 4B.

As the opening is formed in that portion of the plated resist 3 which is not aligned with the pit 2, the Au-plated buried layer 4 has such a flexible shape that a part of the pyramid shape is chipped off. Even if external force is applied to the semiconductor chip 5 having the Au bump 7 with such a shape, the external force is dispersed by the Au bump 7, making it difficult to cause deformation.

(Sixth Embodiment)

FIGS. 7A to 7D are schematic cross-sectional views showing a fabrication method of a wired board with bump electrodes according to a sixth embodiment of the invention, in order of the steps. In FIGS. 7A to 7D, same reference symbols are given to those components which are the same as the corresponding components in FIGS. 2A to 2D.

Figure 7A:
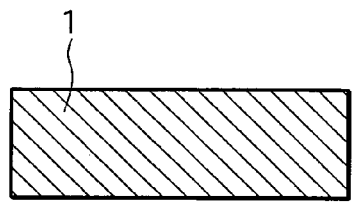
FIGS. 7A to 7D are schematic cross-sectional views showing a fabrication method of a wired board with bump electrodes according to a sixth embodiment of the invention, in order of the steps.

First, an Si substrate having an impurity injected therein at a high concentration of, for example, $1\times10^{17}$ cm$^{-3}$ or higher to have a low electric resistance of $1\times10^{-1}$ Ω-cm or lower is used as the high-concentration impurity Si template 1, as shown in FIG. 7A.

Figure 7B:
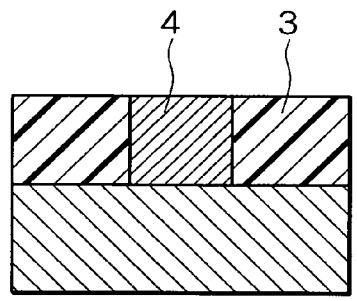

Next, the plated resist 3 is formed on the high-concentration impurity Si template 1 and is opened at the is desired portion after which an electric field is applied to the entire high-concentration impurity Si template 1, Au is buried in the opening in the plated resist 3 by electrolytic plating to form the Au-plated buried layer 4 as shown in FIG. 7B.

Figure 7C:
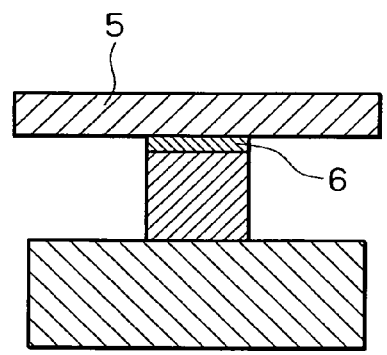
Figure 7D:
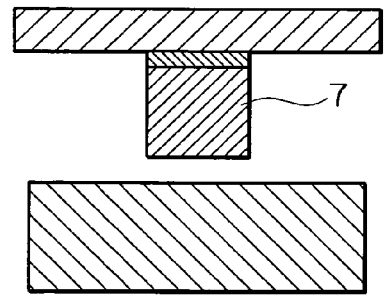

The steps as shown in FIGS. 7C and 7D are the same as those in FIGS. 2C and 2D.

It is to be noted that the rough layer e may be formed inside the pit 2 or on the high-concentration impurity Si template 1 as shown in FIG. 3B, or the Au strike plated layer 9 say be formed inside the pit 2 as shown in FIG. 4B.

Because the high-concentration impurity Si template 1 has a low electric resistance, it is unnecessary to form a seed layer of electrolytic plating. Further, applying an electric field to the high-concentration impurity Si template 1 can allow Au to be buried in the opening in the plated resist 3 by electrolytic plating, which would reduce the number of steps and the cost.

According to the invention, as described above, a conductive layer is formed on a high-concentration impurity semiconductor base having a high strength of adhesion to the conductive layer, making it difficult for the conductive layer to be separated from the high-concentration impurity semiconductor base by external force. This can suppress reduction in yield and can therefore improve the production efficiency of bump electrodes.

What is claimed is:

1. A method of fabricating a wired board with bump electrodes, comprising the steps of:

providing a template formed of a high-concentration impurity semiconductor base; forming a resist having an opening on said high-concentration impurity semiconductor base;

forming a conductive layer in said opening in said resist; and forming a bump electrode on said wired board by aligning an electrode pad formed on said wired board with said conductive layer and then transferring said conductive layer from said template to said electrode pad.

2. The fabrication method according to claim 1, wherein at least the region on said high-concentration impurity semiconductor base where said conductive layer is formed is subjected to strike plating.

3. The fabrication method according to claim 1, wherein the impurity of said high-concentration impurity semiconductor base is a material selected from the group consisting of B, P, As, Sb and Pt.

4. The fabrication method according to claim 1, wherein said conductive layer is formed of a material selected from the group consisting of Au, Cu, Ni, Pt, Pd, Ag, Sn and Pb, and an alloy thereof.

5. The fabrication method according to claim 1, wherein said conductive layer is formed of paste containing a material selected from the group consisting of Au, Cu, Ni, Pt, Pd, Ag, Sn and Pb, and an alloy thereof.

6. The fabrication method according to claim 1, wherein said conductive layer is formed by a method selected from the group consisting of electrolytic plating, electroless plating, sputtering, vapor deposition and printing.

7. The fabrication method according to claim 1, wherein at least the region on said high-concentration impurity semiconductor base where said conductive layer is formed is roughed.

8. The fabrication method according to claim 1, wherein said high-concentration impurity semiconductor base has a pit formed at a position where said conductive layer is formed.

9. The fabrication method according to claim 8, wherein a size of said opening in said resist is smaller than a size of opening of said pit.

10. The fabrication method according to claim 8, wherein a size of said opening in said resist is larger than a size of opening of said pit.

11. The fabrication method according to claim 8, wherein the position of said opening in said resist is shifted from the position of opening of said pit.

12. The fabrication method according to claim 8, wherein said pit has a shape selected from the group consisting of a pointed shape, a pentahedron shape, a pyramid shape and a hemispherical shape.

13. The fabrication method according to claim 8, wherein a depth of said pits is equal to or greater than ¼ of a thickness of said resist.

14. The fabrication method of claim 1, wherein high-concentration impurity semiconductor base has an impurity concentration of $1\times10^{17}$ cm$^{-3}$ or higher.

15. The fabrication method of claim 1, wherein the high-concentration impurity semiconductor base has an impurity concentration in the range of $1\times10^{15}$ cm$^{-3}$ to $1\times10^{22}$ cm$^{-3}$.

* * * * *